(12) United States Patent
Mao et al.

(10) Patent No.: US 11,538,195 B2
(45) Date of Patent: Dec. 27, 2022

(54) METHOD AND SYSTEM FOR PROCESSING IMAGE DATA

(71) Applicant: REALTEK SEMICONDUCTOR CORP., Hsinchu (TW)

(72) Inventors: Wen-Yi Mao, Jiangsu (CN); Jin-Fu Huang, Suzhou (CN); Dai-De Wei, Rizhao (CN)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 255 days.

(21) Appl. No.: 17/101,043

(22) Filed: Nov. 23, 2020

(65) Prior Publication Data

US 2021/0166430 A1    Jun. 3, 2021

(30) Foreign Application Priority Data

Nov. 28, 2019    (CN) .......................... 201911193380.4

(51) Int. Cl.
*G06T 9/00* (2006.01)
*H03M 7/30* (2006.01)
*G06T 3/40* (2006.01)

(52) U.S. Cl.
CPC .................. *G06T 9/00* (2013.01); *G06T 3/40* (2013.01); *H03M 7/6005* (2013.01); *H03M 7/6011* (2013.01)

(58) Field of Classification Search
CPC .... G06T 9/00; G06T 3/40; G06T 9/40; G06T 9/007; G06T 9/005; G06T 9/004; G06T 9/001; H03M 7/6005; H03M 7/6011; H03M 7/3077; H03M 7/4031; H03M 7/425; H03M 7/6023; H03M 7/46; H04N 19/436; H04N 19/88; H04N 19/91; H04N 19/44; H04N 11/146; H04N 11/165; H04N 11/186; H04N 19/42; H04N 19/423; H04N 19/433; H04N 19/426; H04N 19/427; H04N 19/93; H04N 1/419
See application file for complete search history.

(56) References Cited

U.S. PATENT DOCUMENTS

| | | |
|---|---|---|
| 2009/0074052 A1 | 3/2009 | Fukuhara et al. |
| 2011/0200104 A1 | 8/2011 | Korodi et al. |
| 2013/0223536 A1 | 8/2013 | Zhang et al. |

(Continued)

*Primary Examiner* — Duy M Dang
(74) *Attorney, Agent, or Firm* — Li & Cai Intellectual Property (USA) Office

(57) ABSTRACT

A method for processing image data and a system thereof are provided. The method is operated in the system including an encoding system and a decoding system. In the decoding system, multiple image data packages are received from the encoding system. The image data packages include multiple encoded data that are formed by encoding the pixels of an image and the pixels are beforehand rearranged according to an arrangement order. The arrangement order is exemplarily made based on the quantity of encoding circuits of the encoding system. In the decoding system, the encoded data received from the encoding system are sequentially stored in a memory according to the arrangement order. The decoding circuits start to decode the encoded data from an initial code synchronously for enhancing decoding performance. The method can be applied to decoding of high resolution images. The image is reproduced after the decoding process.

18 Claims, 7 Drawing Sheets

(56) References Cited

U.S. PATENT DOCUMENTS

| | | | |
|---|---|---|---|
| 2013/0343668 A1* | 12/2013 | Li | G06T 9/00 |
| | | | 382/244 |
| 2015/0103879 A1* | 4/2015 | Sasai | H04N 19/13 |
| | | | 375/240.01 |
| 2016/0286215 A1 | 9/2016 | Gamei et al. | |

* cited by examiner

METHOD AND SYSTEM FOR PROCESSING IMAGE DATA

CROSS-REFERENCE TO RELATED PATENT APPLICATION

This application claims the benefit of priority to Patent Application No. 201911193380.4, filed on Nov. 28, 2019 in People's Republic of China. The entire content of the above identified application is incorporated herein by reference. Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The disclosure is generally related to a technology of encoding and decoding image data, and more particularly to a method and a system for processing image data for arranging encoded image pixels and decoding the image according to a specific rule.

BACKGROUND OF THE DISCLOSURE

The technologies of compression and decompression are important area of research in the field of image data storage. When outputting a high-resolution video, the data among the output bitstream of a video are greatly dependent upon each other. The back-end data of the bitstream cannot be processed, e.g., decompression, without firstly recognizing the front-end data thereof, especially since the data length of the bitstream is not fixed. Therefore, the front-end data should be decompressed before the back-end data is decompressed. Specifically, the speed of image data processing cannot be increased by processing simultaneously different clips of the image data.

In the technology of image compression and decompression, the image data can be processed with an entropy encoding approach at an encoding end that creates the image data. The entropy encoding approach or technique is an encoding technology that can reduce the amount of data without losing information, i.e., maintaining the quality of the image. Since the quantity of bits of each pixel of the image data to be processed with the entropy encoding approach is not fixed, the output image data should be decoded pixel-by-pixel in an order at the decoding end. The decoding end is such as a video player. The back-end pixels cannot be processed until the front-end pixels are processed because the final bit of the pixel cannot be obtained in advance.

Taking the processing of a 4K or 8K high-resolution video as an example, the back-end data can be processed only after the front-end data is processed due to the processing circuit having a low clock while playing the high-resolution video. The limitation of hardware results in the high-resolution video being unable to be decompressed in real time. To a certain extent, the low-clock circuit restricts the speed of data processing using an image processing system. The insufficient amount of data may result in the video being unstable and flickering.

In the conventional technology, the storage space is required to be increased when decoding two or more pixels simultaneously. The image data may be stored into different storage spaces at the decoding end. Since the data length cannot be recognized in advance, the longest stream of the image data should be stored into a memory in advance, which, however, is wasteful when allocating the resources.

SUMMARY OF THE DISCLOSURE

For solving the problem that a high-resolution video cannot be processed smoothly due to the limitation of hardware, provided herein is a method for processing image data and a system thereof.

In one aspect of the disclosure, the method for processing image data is embodied in a decoding system. The decoding system receives encoded image data packages from an encoding system. The image data packages are rendered by the encoding system. The encoding system re-arranges the pixels of a video according to an arrangement order, and the re-arranged pixels are encoded to form a plurality of groups of encoded data. In the decoding system, the plurality of groups of encoded data are stored to a memory in accordance with the arrangement order. After that, a plurality of decoding circuits synchronously decode initial codes of the groups of encoded data so as to output the reproduced video after decoding.

Further, when the decoding system performs a decoding process, it uses the plurality of decoding circuits to decode the codes with a quantity according to the quantity of the image data packages.

Further, in the encoding system, the pixels of the image are orderly numbered and the arrangement order indicates that the pixels with a numbering interval of the number of the decoding circuits are configured to be one group so as to from the groups of encoded data after encoding. The groups of encoded data are packaged as the plurality of image data packages. In one embodiment of the disclosure, the maximum of the mentioned quantity is the quantity of the decoding circuits of the decoding system.

In one embodiment of the disclosure, in the encoding system, according to the quantity, e.g., 'n', the pixels of the image are arranged as a first group of pixels to an $n^{th}$ group of pixels according to the arrangement order. The quantity 'n' is the quantity of the decoding circuits of the decoding system to perform the current decoding process. The pixels are encoded as a first group of encoded data to an $n^{th}$ group of encoded data that are packaged as a plurality of image data packages. The image data packages are transmitted to the decoding system. In the decoding system, the first group of encoded data to the $n^{th}$ group of encoded data are stored to the memory according to the arrangement order, and the initial code of every one of groups of encoded data is recorded for synchronously decoding the groups of encoded data from a high position to a low position.

In one more aspect of the disclosure, the image data processing system includes a decoding system that includes a plurality of decoding circuits. The encoding system performs a decoding process upon the image data packages. The plurality of encoded image data packages include multiple groups of encoded data that are formed by encoding the pixels of an image in which the pixels are rearranged according to an arrangement order. In the decoding system, the groups of encoded data are stored to a memory according to an arrangement order while encoding. The plurality of decoding circuits synchronously decode the initial codes with respect to the encoded data. An image is outputted after decoding.

The image data processing system further includes an encoding system. In the encoding system, the pixels of the image are numbered in numerical order. The arrangement order indicates that the pixels with a numbering interval of the quantity of the decoding circuits are configured to be one group so as to from the groups of encoded data after encoding. The groups of encoded data are then packaged as the plurality of image data packages. According to one embodiment, the maximum of the mentioned quantity is the quantity of the decoding circuits of the decoding system.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
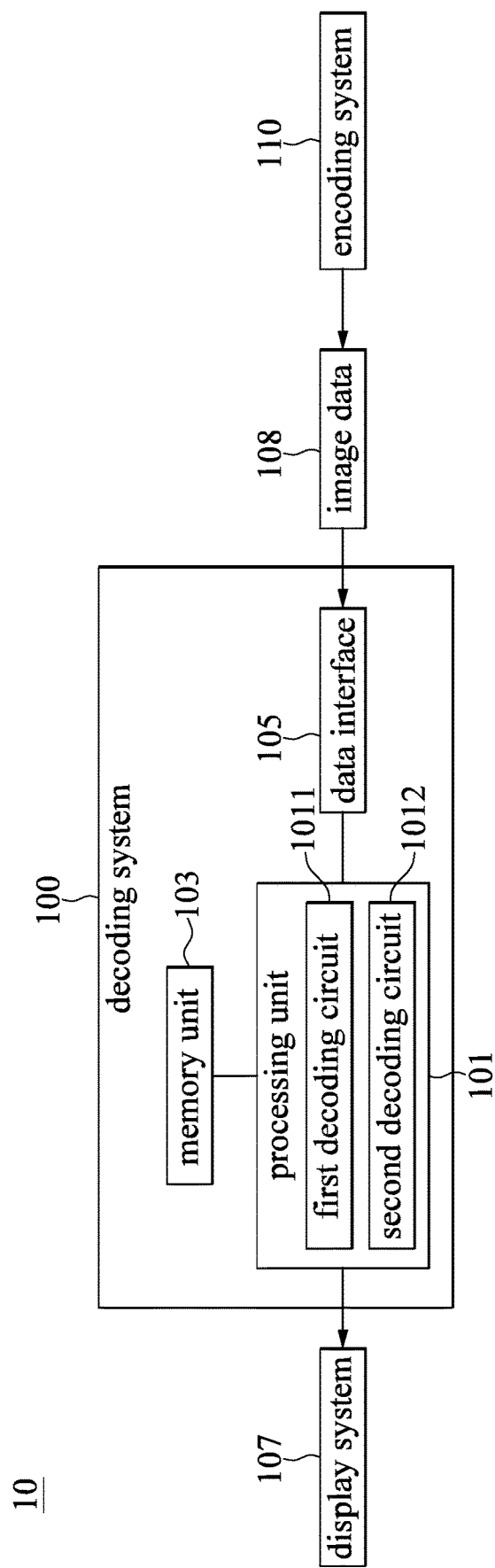
FIG. 1 is a schematic diagram depicting a circuit framework of an image data processing system in one embodiment of the disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

In the technology of image compression and decompression, if image quality is taken into account, an encoding end for forming the image data performs a lossless encoding process, namely entropy encoding. Since the quantity of bits of every pixel in the image data that is processed with entropy encoding may not be fixed, it is difficult for a decoding end to anticipate the length of a bitstream and the last bit. Thus, the following pixel cannot be processed if the preceding pixel has not been processed yet. Further, a high-resolution video may not be decompressed and played smoothly under the hardware having limited processing power. The conventional technology achieves the purpose of decoding two pixels simultaneously by adding storage space.

However, in view of the issues associated with conventional decoding technology for high-resolution videos, provided herein is a method for processing image data and a system that re-arranges the image pixels when performing an encoding process. A coding order of the pixels can be changed when the image pixels are re-arranged. On the other hand, a processing circuit of the system can decode two or more pixels simultaneously without acquiring the length of the bitstream of the encoded pixels in advance. Therefore, the image processing speed can be effectively doubled or be faster. The image data can be processed (i.e., decoding) smoothly even with limited hardware processing power.

FIG. 1 is a schematic diagram depicting the system for processing image data according to one embodiment of the disclosure. An image data processing system 10 implements a decoding system. The decoding system 100 is applied to a computer device or an integrated circuit (IC). The decoding system 100 receives encoded image data 108 from an encoding system 110. The image data 108 is encoded according to a specific encoding format. The decoding system 100 performs the method for processing image data in one embodiment of the disclosure.

In the encoding system 110, for example, the pixels of a video frame or some blocks are separated into odd pixels and even pixels respectively according to their numbers. The odd pixels and the even pixels are encoded into two image data packages. The pixels are processed by a lossless encoding process for forming a variable length encoded data that can be separated into a first group of encoded data and a second group of encoded data. After that, the first group of encoded data and the second group of encoded data are transmitted to the decoding system 100.

According to the above description, the image data processing system 10 includes the decoding system 100 and the encoding system 110. The main components of the decoding system 100 include a processing unit 101. The processing unit 101 is such as a processor that is configured to process images. The processing unit 10 can be a digital signal processor or a central processing unit that is used for decoding the image data. The processing unit 101 of the decoding system 100 can include two groups of decoding circuits that allow the encoding system 110 to place the image into the first group of encoded data or the second group of encoded data. The first group of encoded data can be the odd image data package and the second group of encoded data can be the even image data package. The first decoding circuit 1011 and the second decoding circuit 1012 can decode the first group of encoded data and the second group of encoded data at the same time.

According to the embodiment of the disclosure, the processing unit 101 of the decoding system 100 is configured to have multiple decoding circuits according to the design requirement. As shown in the diagram, a first decoding circuit 1011 and a second decoding circuit 1012 are included. The quantity of the decoding circuits is not limited to the exemplary example. However, the quantity of the encoded data of the image data packages generated by the encoding system 110 may not exceed the quantity of the decoding circuits of the decoding system 100. The maximum of the quantity of the encoded data is the quantity of the decoding circuits of the decoding system 100.

Further, the decoding system 100 receives the image data 108 from the decoding circuits via a data interface 105. The image data 108 can be the image data packages in which the pixels are encoded according to an arrangement order. The decoding system 100 arranges the image data 108 to a memory unit 103 based on the arrangement order. The memory unit 103 can be any type of memory of the decoding system 100. When the processing unit 101 performs the decoding process, the encoded data to be arranged is retrieved from the memory unit 103. The processing unit 101 performs the encoding process and then reproduces the image. The output image is transmitted to a display system 107 for displaying.

In one embodiment of the disclosure, when the encoding system 110 performs an encoding process upon an image such as a video frame, it is not necessary to process the entire image at once with the encoding process, but to process image blocks divided from the image one by one according to conditions of hardware, software or specific requirements. When encoding, the pixels of the selected image blocks are numbered orderly (i.e., 1, 2, 3, etc.), and are grouped according to an arrangement order. It should be noted that the pixels are grouped into a number of groups which is the same in number as or not more than the quantity of the decoding circuits of the decoding system 100. For example, the orderly-numbered pixels whose numbers are with an interval the same with the quantity of the decoding circuits are grouped into one group. The grouped pixels are encoded as multiple groups of encoded data. The groups of encoded data are packaged to form multiple image data packages which are shown as the image data 108.

Figure 2:
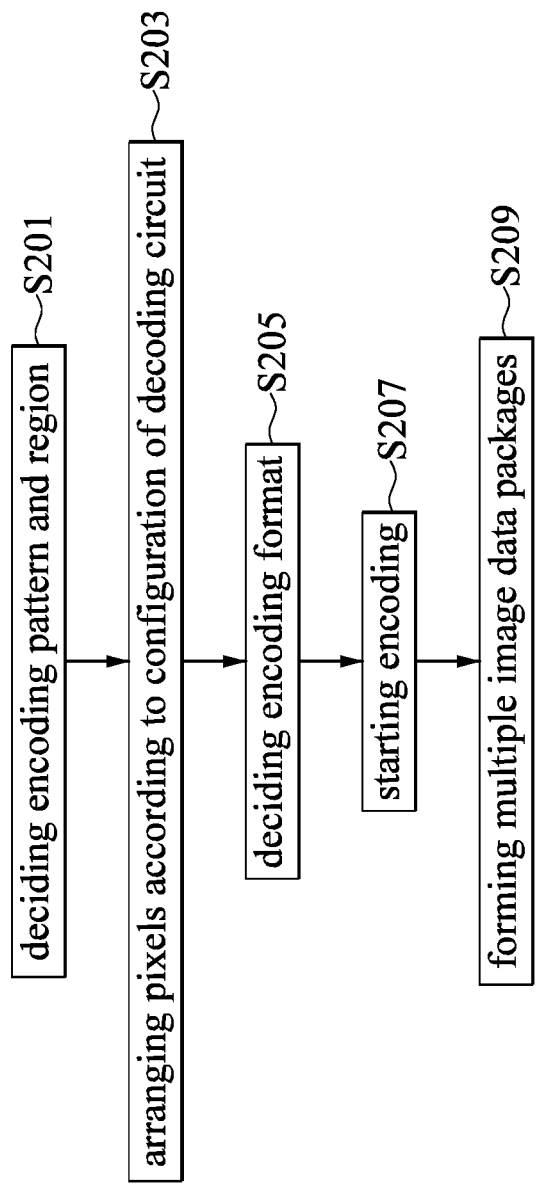
FIG. 2 is a flow chart describing a method for processing image data in one embodiment of the disclosure.

FIG. 2 shows a flow chart describing an encoding process in a method for processing image data according to one embodiment of the disclosure.

In step S201, in an encoding system, an encoding pattern and a region of an image to be encoded are firstly decided. After that, in step S203, the pixels of the region are arranged according to the configuration of decoding circuits. The quantity of the decoding circuits acts as a main reference to arrange the pixels of the image. For example, if the quantity of the decoding circuits is 'n', the pixels are grouped into 'n' or smaller number of groups based on the pixel numbers. For allowing a decoding system to decode the encoded data with double or higher synchronous decoding performance, the pixels should be arranged according to an arrangement order. The performance being achieved depends on the capacity and quantity of the decoding circuits. For example, the pixels whose numbers are with an interval of 'n' or smaller number than the quantity (i.e., 'n') of the decoding circuits are grouped into one group. In step S205, an encoding format is decided. An encoding process starts in step S207 in order to encode the multiple groups of pixels into multiple groups of encode data. The multiple groups of encoded data are packaged to form multiple image data packages, such as in step S209.

Figure 3:
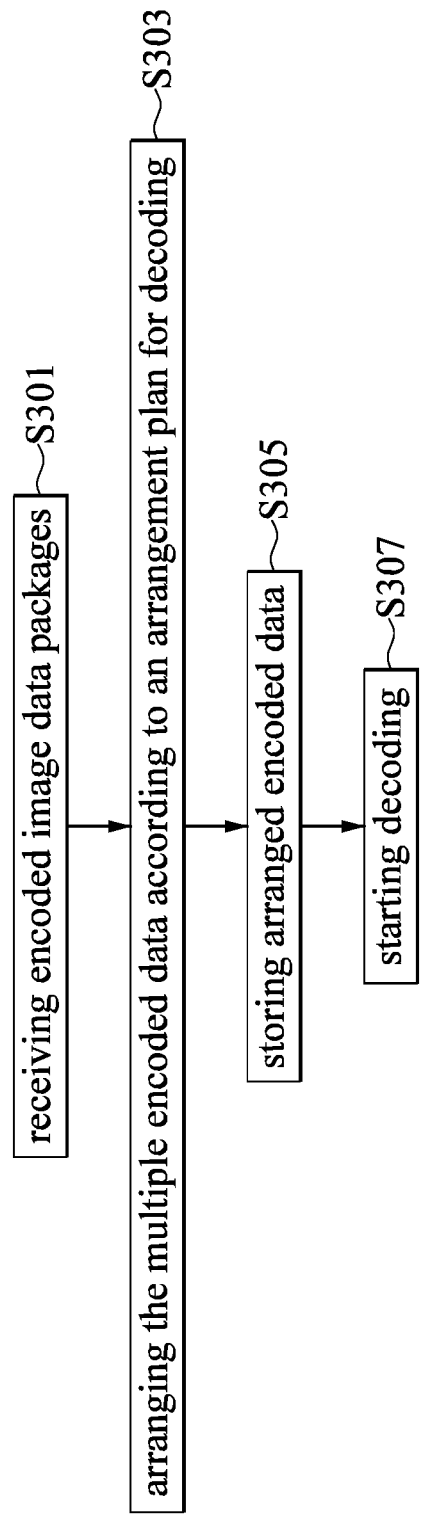
FIG. 3 is a flow chart describing a decoding process in the method for processing image data according to one embodiment of the disclosure.

FIG. 3 shows a flow chart describing a decoding process in the method for processing image data in one embodiment of the disclosure.

In the beginning, such as in step S301, the decoding system in an image data processing system receives two or more (i.e., 'n' or smaller quantity) image data packages. These image data packages may cover an image or a portion of an image. The quantity of the image data packages is decided based on the quantity of decoding circuits of the decoding system of the image data processing system. The multiple image data packages include the encoded data covering an entire image or a portion of the image. The image data packages can be formed by encoding the pixels that are grouped according to the arrangement order. The number and an encoding format of the image data packages should be in compliance with configuration of the decoding system.

When the decoding system receives the image data packages, the encoded data of the image data packages are arranged into a memory according to a configuration of the memory. Such as in step S303, the encoded data are arranged according to the arrangement order. The initial code such as a header of every group of encoded data is arranged at an address of the memory that is the address configured for the start of a decoding process. For example, a starting address or an ending address of the memory can be the address where the decoding process starts. The rest encoded data is arranged in an order. After the arrangement according to the arrangement order, the arranged encoded data is then stored to the memory of the image data processing system, such as in step S305. After that, the decoding circuits of the decoding system retrieve the encoded data from multiple addresses where start the decoding process in the memory. Each of the decoding circuits then starts decoding the retrieved data. The multiple decoding circuits can decode the pixels synchronously since the quantity of the decoding circuits corresponds to the quantity of the image data packages. In step S307, the image can be reproduced from the pixels according to the pixel numbers. The method for processing image data achieves that the image data can be decoded quickly even though the decoding system has a limited hardware processing capability and the pixel encoding length cannot be acknowledged in advance.

Before performing the method for processing image data, the image may be processed with a fixed compression ratio or a lossless compression method when the encoding system performs the encoding process. It should be noted that a storage space can be well configured for storing the encoded image data in the encoding process with a fixed compression ratio if the image resolution is given. In another case, if the image resolution is also given, the storage space required to store the entire encoded image can also be estimated even if the encoding process uses the lossless compression method.

Thus, no matter whether the encoding process is performed with a compression ratio or a lossless compression method, the data stream of the multiple image data packages are filled into the memory from its starting address (e.g., the left side of the diagram of FIG. 4) and ending address (the right side of the diagram of FIG. 4), respectively, and approaches the middle of the memory if the storage space required to store the image data can be obtained in advance.

Figure 4:
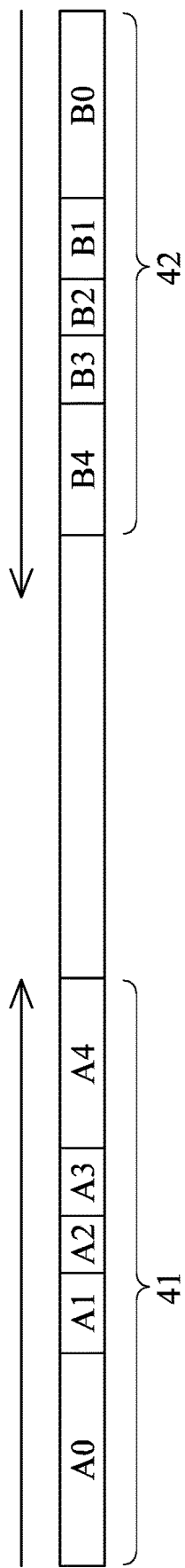
FIG. 4 is a schematic diagram depicting image data that is arranged in the method for processing image data in one embodiment of the disclosure.
Figure 6:
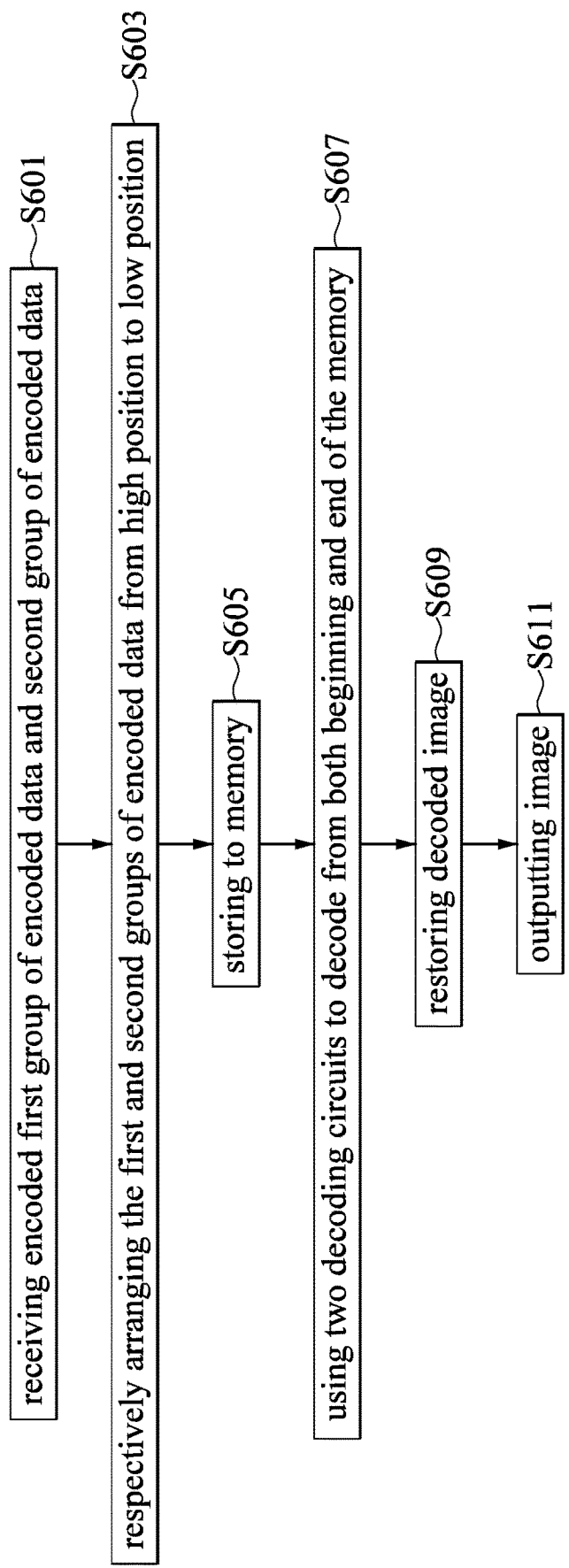
FIG. 6 shows a flow chart describing the method for processing image data in one embodiment of the disclosure.

Reference is made to FIG. 4 which shows a schematic diagram depicting the arrangement of image data in the method according to one embodiment of the disclosure, and reference is also made to FIG. 6 that exemplarily describes a process for processing the image.

In step S601 of FIG. 6, in view of FIG. 4, the decoding system receives a first group of encoded data 41 and a second group of encoded data 42. In step S603 of FIG. 6, according to an arrangement order, the groups of encoded data (41, 42) are arranged from a high position to a low position respectively. As shown in the diagram, the encoded data of the two image data packages are re-arranged to a memory from a starting position and an ending positon respectively, and approaching the middle or center position of the memory.

The first group of encoded data 41 includes a header A0 and the subsequent data A1 to A4. The second group of encoded data 42 includes a reserved header B0 and the subsequent data B1 to B4. The diagram schematically shows the data arranged in an order and also shows a storage space that can store the image data in numerical order. The storage space can be implemented by a series of memory blocks of a memory unit (e.g., memory unit 103 of FIG. 1) of a decoding system. The memory blocks are used for storing the encoded image data. The method for processing image data of the disclosure performs a decoding process upon the encoded image data.

Further, one image data package may only include one header A0, and the reserved header B0 can be ignored. The header records an encoding format with respect to the image data package, quantity of image data packages of an image and a decoding method. The header also records an order of the pixels of the image and a decoding order of every image data package. The decoding order corresponds to the arrangement of the pixels to be encoded.

In the present example, data stream of the first group of encoded data 41 is orderly arranged from left to right. The beginning of the first group of encoded data includes a header A0 at the starting position (i.e., the leftmost address). In an exemplary example, the data A1 to A4 are filled into the memory in numerical order. The data stream of the first group of encoded data 41 is filled into the memory from the leftmost position that is configured to be a highest position to the right, i.e., the low position. The data A1 to A4 represent the image data, and the pixels therein are processed with a lossless encoding process. The data A1 to A4 may denote a variable length encoded data after performing an entropy encoding process upon the pixels of the image data package.

On the other hand, the rightmost positon of the memory can be used to store a reserved header B0 (ignorable) that is used to record information of an image compression format. The right side is set as a high position. The rest data B1 to B4 of the second group of encoded data 42 are then stored from the ending position (i.e., the high position) to the left (i.e., the low position). The data B1 to B4 denote another variable length encoded data after performing entropy encoding process upon the pixels of the image data package.

The data A1 to A4 of the first group of encoded data 41 and the data B1 to B4 of the second group of encoded data 42 represent the data that is generated from the pixels undergoing the lossless encoding process. After performing the lossless encoding process, the length of the encoded pixel is not fixed. As shown in the diagram, the lengths of data blocks are different.

Next, such as in step S605 of FIG. 6, the arranged encoded data are temporarily stored in the memory of the decoding system. For example, the two groups of encoded data are provided to the decoding circuits to decode according to the arrangement order. Referring to the embodiment shown in FIG. 4, the first group of encoded data 41 and the second group of encoded data 42 are stored to the memory according to the arrangement order. The decoding circuits start to decode the data from the initial codes with respect to the two groups of encoded data.

In the memory of the decoding system, the memory address of the initial code of the first group of encoded data 41 is at the left of the storage space. Aside from the header A0, the data A1 to A4 are orderly stored to the memory. Specifically, the data A1 to A4 are filled in the memory from the leftmost side and the memory position with respect to the left end of data A1 is configured to be the Most Significant Bit (MSB), and the memory position with respect to the right end of data A1 is the Least Significant Bit (LSB). The first group of encoded data 41 is filled in the memory from MSB to LSB. The direction of decoding process is also from MSB to LSB.

Similarly, the second group of encoded data 42 is stored from its initial code that is also decoded at first. Besides the reserved header B0, the data B1 to B4 of the second group of encoded data 42 denote the encoded data undergoing the lossless encoding process. The second group of encoded data 42 is stored to the memory from right side to the left. The memory position with respect to the right end of data B1 is configured to be MSB, and the memory positon with respect to the left end of data B1 is LSB. The second group of encoded data 42 is filled to the memory from MSB to LSB. The direction of decoding process is also from MSB to LSB.

In the encoding system, the arranged pixels of the image are divided into two groups such as the abovementioned first group of pixels that includes the pixels numbered with odd numbers and the second group of pixels that includes the pixels numbered with even numbers. In the decoding system, the decoding process is performed upon the plurality of image data packages with the same quantity of decoding circuits. The maximum of the number is the quantity of the decoding circuits of the decoding system. In step S607 of FIG. 6, two decoding circuits decode the data retrieved from the starting address and the ending address of the memory respectively. The decoding system includes a first decoding circuit that is used to decode the first group of encoded data from the starting address of the memory, and a second decoding circuit that is used to decode the second group of encoded data from the ending address of the memory, such as in step S609 of FIG. 6. The image is reproduced and outputted after the decoding process, such as in step S611 of FIG. 6.

Figure 7:
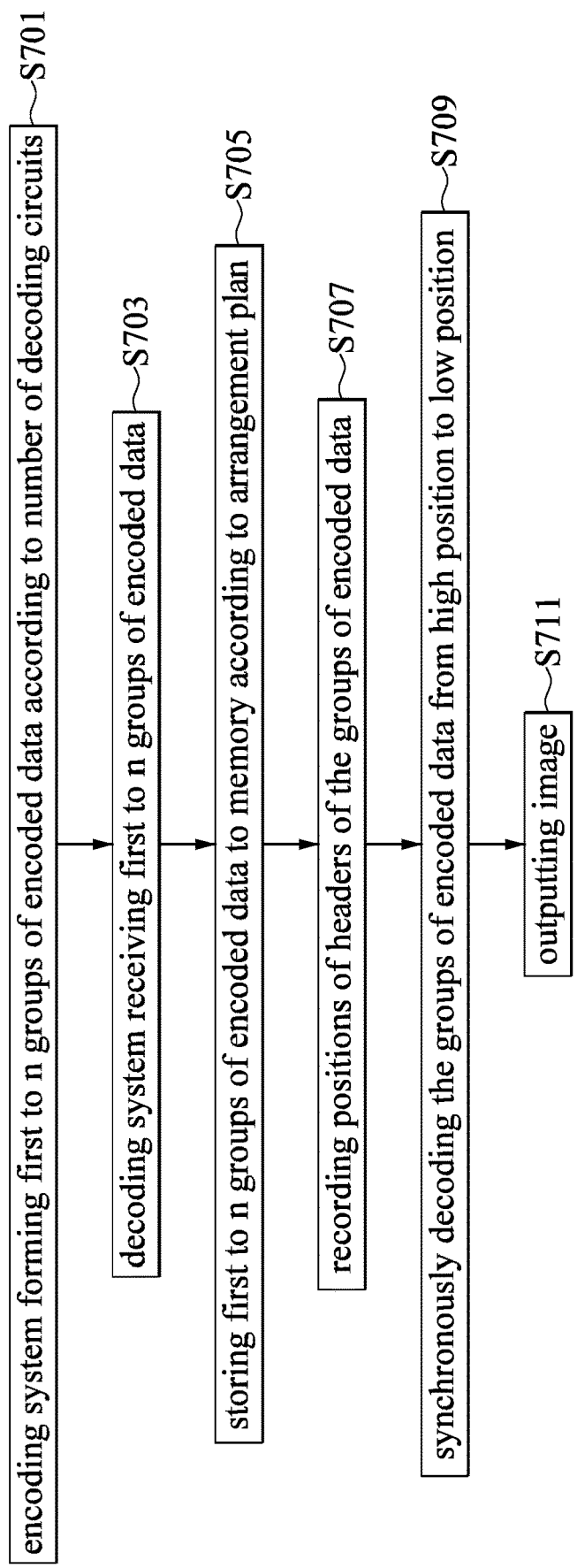
FIG. 7 shows one further flow chart describing the method for processing image data in one further embodiment of the disclosure.

Reference is next made to FIG. 7 which shows a flow chart describing the method for processing image data in one embodiment of the disclosure.

According to the description of above embodiments, in the encoding system, the pixels of image are re-arranged for forming a first group of pixels to $n^{th}$ group of pixels according to an arrangement order with a preset number (i.e., 'n'). The number 'n' can be the quantity of the decoding circuits used in the decoding system, but the quantity of decoding circuits is not limited in the present disclosure. The pixels are encoded by the encoding system so as to form the first group of encoded data to $n^{th}$ group of encoded data. The groups of encoded data are packaged into multiple image data packages that are provided to the decoding system. When transmitting the image data packages to the decoding system, the first group of encoded data to the $n^{th}$ group of encoded data are stored to the memory according to an arrangement order, such as in step S701 of FIG. 7.

Figure 5:
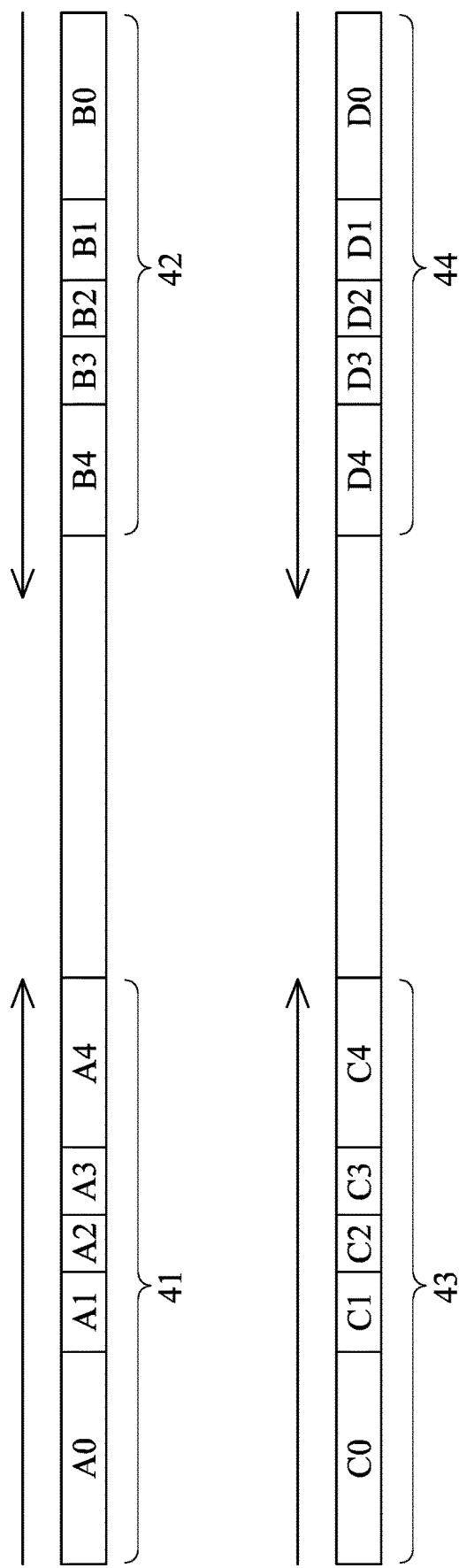
FIG. 5 is a schematic diagram depicting arrangement of image data in the method according to one embodiment of the disclosure.

As shown in FIG. 5, the arrangement of image data in the method according to one further embodiment is disclosed. The image data is encoded by the encoding system for forming four groups of encoded data. Therefore, the decoding system needs four decoding circuits to decode the four groups of encoded data synchronously. The four groups of encoded data shown in the figure denote the encode data formed by encoding the pixels that are re-arranged according to the arrangement order. The four groups of encoded data include a first group of encoded data 41 that includes a header A0 and data A1, A2, A3 and A4, a second group of encoded data 42 that includes a reserved header B0 and data B1, B2, B3 and B4, a third group of encoded data 43 that includes a reserved header C0 and data C1, C2, C3 and C4, and a fourth group of encoded data 44 that includes a reserved header D0 and data D1, D2, D3 and D4.

In step S703 of FIG. 7, the decoding system receives the first group of encoded data to $n^{th}$ group of encoded data. The decoding system relies on the arrangement order to store the groups of encoded data to the memory. The decoding system records the initial codes with respect to the groups of encoded data after re-arranging the data in the memory. In step S705, the memory address for storing the initial codes are the positions of the headers with respect to the groups of encoded data.

FIG. 5 also shows a schematic diagram depicting four groups of encoded data. For obtaining continuous pixels, the encoded data should be decoded orderly in the decoding process. In the encoding system, the pixels of image are numbered orderly. The pixels are then re-arranged according to the arrangement order. For example, the pixels whose numbers are with an interval of a specific number (e.g., 4 that is the same or smaller number of the decoding circuits) are grouped into one group. After encoding the grouped pixels, the multiple groups of encoded data are formed. The present example shows that the pixels of the first group of encoded data 41 are numbered with 1, 5, 9, 13, etc., the pixels of the second group of encoded data 42 are numbered with 2, 6, 10, 14, etc., the pixels of the third group of encoded data 43 are numbered with 3, 7, 11, 15, etc., and the pixels of the fourth group of encoded data 44 are numbered with 4, 8, 12, 16, etc.

Next, in step 707, the decoding system synchronously decodes the groups of encoded data from their initial codes, e.g., the headers at the high position, to the low positions. An image is reproduced by the decoding process and outputted, such as in step S709.

In conclusion, according to the above description, the conventional decoding system may not acknowledge the length of every image pixel that is processed with an entropy encoding process, cannot handle the high-resolution image due to the hardware limitation, or cannot decode the pixels within any present time, e.g., a clock cycle. Therefore, the conventional system may suffer in terms of being unable to satisfy time constraints, since it has not enough time to decode the current pixel as the next pixel enters. The method for processing image data in the present disclosure provides a solution that the pixels of image are divided into two or more groups at the decoding end based on the configuration of the decoding system. The system successfully allows the hardware with lower processing power, e.g., a lower clock processor, to process a high-resolution image, for example, to decode a 4K or 8K static image or video.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for processing image data, comprising:
receiving by a decoding system a plurality of encoded image data packages from an encoding system, the plurality of encoded image data packages including multiple groups of encoded data that are formed by encoding the pixels of an image in which the pixels are rearranged according to an arrangement order;
storing by the decoding system the groups of encoded data to a memory according to the arrangement order;
synchronously encoding an initial code of every one of the groups of encoded data; and
outputting the image after the initial code of every one of the groups of encoded data is encoded.

2. The method according to claim 1, wherein the decoding system performs decoding upon the plurality of image data packages with decoding circuits of the same quantity.

3. The method according to claim 2, wherein, in the encoding system, the pixels of the image are numbered in numerical order and the arrangement order indicates that the pixels with a numbering interval of the quantity of the decoding circuits are configured to be one group so as to form the groups of encoded data after encoding; and the groups of encoded data are packaged as the plurality of image data packages.

4. The method according to claim 3, wherein a maximum of the numbering interval is the quantity of the decoding circuits of the decoding system.

5. The method according to claim 3, wherein, in the encoding system, according to the quantity, the pixels of the image form a first group to an $n^{th}$ group of pixels according to the arrangement order, wherein n is the quantity of decoding circuits; the first group of encoded data to the $n^{th}$ group of encoded data are packaged as the plurality of image data packages that are transmitted to the decoding system; in the decoding system, the first group of encoded data to the $n^{th}$ group of encoded data are stored to the memory according to the arrangement order, and the initial code of every group of encoded data is recorded for synchronously decoding the groups of encoded data from a high position to a low position.

6. The method according to claim 5, wherein the initial code of every group of encoded data is a header or a reserved header formed by encoding the group of encoded data.

7. The method according to claim 5, wherein, in the encoding system, the first group of pixels of the image are arranged according to the arrangement order and encoded to be the first group of encoded data; and the second group of pixels of the image are arranged according to the arrangement order and encoded to be the second group of encoded data.

8. The method according to claim 7, wherein, in the decoding system, starting with the initial code of the first group of encoded data, the first group of encoded data are filled into the memory from a high position at a beginning of the memory to a low position; and starting with the initial code of the second group of encoded data, the second group of encoded data are filled into the memory from a high position at an end of the memory to a low position; and the encoded data are decoded simultaneously from both the beginning and the end.

9. The method according to claim 8, wherein the decoding system includes a first decoding circuit used to decode the first group of encoded data from the beginning of the memory; and a second decoding circuit used to decode the second group of encoded data from the end of the memory.

10. The method according to claim 7, wherein the first group of pixels are the pixels numbered with odd numbers and the second group of pixels are the pixels numbered with even numbers.

11. An image data processing system, comprising:
a decoding system including a plurality of decoding circuits that perform the steps of:
receiving a plurality of image data packages that include multiple groups of encoded data that are formed by encoding the pixels of an image, in which the pixels are rearranged according to an arrangement order;
storing the groups of encoded data to a memory according to the arrangement order;
synchronously encoding an initial code of every one of groups of encoded data; and
outputting the image after the initial code of every one of groups of encoded data is encoded.

12. The system according to claim 11, wherein the decoding system performs decoding upon the plurality of image data packages with decoding circuits of the same quantity.

13. The system according to claim 12, further comprising an encoding system, in the encoding system, the pixels of the image are numbered in numerical order and the arrangement order indicates that the pixels with a numbering interval of the quantity of the decoding circuits are configured to be one group so as to form the groups of encoded data after encoding; and the groups of encoded data are packaged as the plurality of image data packages.

14. The system according to claim 13, wherein a maximum of the number is the quantity of the decoding circuits of the decoding system.

15. The system according to claim 13, wherein, in the encoding system, according to the quantity, the pixels of the image form a first group to a $n^{th}$ group of pixels according to the arrangement order wherein n is the quantity of decoding circuits; the first group of encoded data to the $n^{th}$ group of encoded data are packaged as the plurality of image data packages that are transmitted to the decoding system; in the decoding system, the first group of encoded data to the $n^{th}$ group of encoded data are stored to the memory according to the arrangement order, and the initial code of every group of encoded data is recorded for synchronously decoding the groups of encoded data from a high position to a low position.

16. The system according to claim 15, wherein, in the decoding system, starting with the initial code of the first group of encoded data, the first group of encoded data are filled into the memory from a high position in a beginning of the memory to a low position; and starting with the initial code of the second group of encoded data, the second group of encoded data are filled into the memory from a high position at an end of the memory to a low position; and the encoded data are decoded simultaneously from both the beginning and the end.

17. The system according to claim 16, wherein the decoding system includes a first decoding circuit used to decode the first group of encoded data from the beginning of the memory; and a second decoding circuit used to decode the second group of encoded data from the end of the memory.

18. The system according to claim 16, wherein the first group of pixels are the pixels numbered with odd numbers and the second group of pixels are the pixels numbered with even numbers.

* * * * *